(12) United States Patent
Osawa

(10) Patent No.: US 6,742,149 B2
(45) Date of Patent: May 25, 2004

(54) APPARATUS FOR TESTING SEMICONDUCTOR INTEGRATED CIRCUITS

(75) Inventor: Tokuya Osawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 502 days.

(21) Appl. No.: 09/849,255

(22) Filed: May 7, 2001

(65) Prior Publication Data

US 2002/0026612 A1 Feb. 28, 2002

(30) Foreign Application Priority Data

Aug. 29, 2000 (JP) .......................... 2000-259863

(51) Int. Cl.⁷ .......................................... G01R 31/3177
(52) U.S. Cl. ...................................................... 714/726
(58) Field of Search .................................. 714/726, 724

(56) References Cited

U.S. PATENT DOCUMENTS 5,717,702 A * 2/1998 Stokes et al. ............... 714/730
5,815,512 A    9/1998 Osawa et al.
6,510,534 B1 * 1/2003 Nadeau-Dostie et al. ... 714/724
6,570,407 B1 * 5/2003 Sugisawa et al. ........... 714/724

FOREIGN PATENT DOCUMENTS

JP          8-94718      4/1996
JP          11-30646     2/1999

* cited by examiner

*Primary Examiner*—R. Stephen Dildine
(74) *Attorney, Agent, or Firm*—Leydig, Voit & Mayer, Ltd.

(57) ABSTRACT

An apparatus for testing a semiconductor integrated circuit using an actual operating frequency of the semiconductor integrated circuit includes a test target circuit which is to be tested and has a scan path in the test target circuit for executing a test. The apparatus also includes a test pattern generation circuit which generates, after completion of the test, a signal for scanning out a test result synchronously with an edge of a test clock signal with a lower frequency than the actual operating frequency, and outputs a scan-out control signal to the scan path.

3 Claims, 9 Drawing Sheets

US 6,742,149 B2

1

APPARATUS FOR TESTING SEMICONDUCTOR INTEGRATED CIRCUITS

FIELD OF THE INVENTION

The present invention in general relates to an apparatus with which whether a semiconductor integrated circuit, such as a memory and IP (intellectual property: the functional block of an electronic circuit), is functioning properly, or not, can be determined. More specifically, this invention relates to an apparatus which uses an actual operating frequency for testing the semiconductor integrated circuit.

BACKGROUND OF THE INVENTION

As an example of the apparatus for testing a semiconductor integrated circuit, an apparatus which is built in the semiconductor integrated circuit (i.e. target for the test or a test target) and which conducts a BIST (Built-In Self Test) is known. The standard specification of a BIST interface is that specified by IEEE1149.1. It is becoming general to actuate the BIST using states and an external dedicated pin prepared in the IEEE1149.1.

FIG. 12 is a block diagram of the conventional semiconductor integrated circuit utilizing the IEEE1149.1. This semiconductor integrated circuit comprises a test target circuit 61. The semiconductor integrated circuit further comprises a test pattern generation circuit 62 which generates a signal to be used for the test (i.e. a test signal) and outputs the test signal to the test target circuit 61, a test result compression circuit 63 which receives a result of the test (i.e. a test result) from the test target circuit 61 and compresses the test result. The semiconductor integrated circuit further comprises a test data register 64 which outputs data to the test pattern generation circuit 62 and receives the compressed test results from the test result compression circuit 63. The semiconductor integrated circuit further comprises a TAPc (test access port controller) 65 which receives a test data-in (TDI) signal and a test mode select (TMS) signal from a not shown signal generation apparatus provided outside the semiconductor integrated circuit, and outputs data to the test data register 64. The semiconductor integrated circuit further comprises a selector circuit 66 which selects either a signal from the test data register 64 or a signal from the TAPc 65 under the control by the TAPc 65 and outputs the selected signal. The semiconductor integrated circuit further comprises a flip-flop (FF) circuit 67 which latches the signal output by the selector circuit 66 at the timing of the falling edge of a test clock (TCK) signal used for the test and outputs the signal to a TDO (test data-out) terminal.

The TAPc 65 outputs a test mode change-over signal (TESTMODE signal) for controlling change-over between a test mode for executing the test and a normal operation mode for conducting a normal operation with respect to the test pattern generation circuit 62 and the test data register 64. While FIG. 12 shows a case where the TAPc 65 sets the TESTMODE signal, the TESTMODE signal may be set directly from the external pin of a chip.

FIG. 13 is a block diagram which shows a detail configuration of the test target circuit 61, the test result compression circuit 63 and the test data register 64 shown in FIG. 12. The test target circuit 61 comprises a plurality of test target blocks 71-1 to 71-3, and test result holding circuits 72-11 to 72-14, 72-21 to 72-23 and 72-31 to 72-33 which receive the test result from the output terminals DO71 to DO74, DO81 to DO83 and DO91 to DO93 of the test target blocks 71-1 to 71-3, respectively, and hold the test results.

2

The test result compression circuit 63 comprises AND circuits 73-1 to 73-3 which receive the test result shifted out from test result holding circuits 72-1 to 72-14, 72-21 to 72-23 and 72-31 to 72-33 corresponding to the respective test blocks 71-1 to 71-3 at input terminals thereof, and holding circuits 74-1 to 74-3 holding the output signals of the respective AND circuits 73-1 to 73-3 and outputting the held signals to the other input terminals of the respective AND circuits 73-1 to 73-3 and to the test data register 64.

The test target circuit 61, the test pattern generation circuit 62 and the test result compression circuit 63 operate using a system clock (SYSCLK) signal with an actual operating frequency. On the other hand, the test data register 64 and the TAPc 65 operate using a TCK signal with a lower frequency than the actual operating frequency. The test result compression circuit 63 compresses the test results from the output terminals DO71 to DO74, DO81 to DO83 and DO91 to DO93 into one bit for the test target blocks 71-1 to 71-3, respectively, and outputs the compressed test results to the test data register 64. The number n of bits of the test data register 64 is set higher than the number m of bits after compression by the test result compression circuit 63.

Operation of this semiconductor integrated circuit will now be explained. To begin with, an instruction to select the test data register 64 is applied to the IR (instruction register) of the TAPc 65. When such an instruction is received, the TESTMODE signal changes from "0" to "1" and the semiconductor integrated circuit shifts into a test mode. Next, the instruction is set to the test data register 64 in a ShiftDR state. The instruction is applied from the test data register 64 to the test pattern generation circuit 62 in an UpdateDR state. A BIST is then executed in a RunTest/Idle state and a test result is acquired. This test result is compressed by the test result compression circuit 63. In a CaptureDR state, the test results compressed by the test result compression circuit 63 are stored in the test data register 64. In a ShiftDR state, the data stored in the test data register 64 is outputted from the TDO terminal.

As can be seen, initial settings and test results are outputted to the TDO terminal using the low frequency TCK signal. The test operation is carried out using the SYSCLK signal with an actual operating frequency which is used when the semiconductor integrated circuit actually operates. By doing so, it is possible to decelerate signals, other than the SYSCLK signal, and to reduce tester cost.

The conventional technique has the following disadvantages. That is, a faulty section cannot be pinpointed accurately since the test results are outputted after being compressed. Such a detailed faulty section can be specified if a test data register with the same number of bits as that of the bits of the test result holding circuits is provided and test results are outputted without being compressed. However, this results in an increase of the size of the test data register and increase of the number of wires between the test result holding circuits and the test data register and it is, therefore, not practical.

SUMMARY OF THE INVENTION

It is an object of the present invention to provide an apparatus accurately pinpointing a faulty section in a semiconductor integrated circuit without increasing the scale of the apparatus.

The apparatus according to the present invention uses the actual operating frequency when testing the semiconductor integrated circuit. The apparatus comprises a test circuit having a scan path formed for executing a test and a control circuit which generates, after completion of the test, a scan-out control signal for scanning out a test result synchronously with an edge of a test clock signal with a lower frequency than the actual operating frequency, and outputs the scan-out control signal to the test circuit. Thus, the test circuit having the scan path tests the semiconductor integrated circuit, and, after the completion of the test, the control circuit generates a scan-out control signal for scanning out a test result synchronously with the edge of a test clock signal with a lower frequency than the actual operating frequency and outputs the scan-out control signal to the test circuit. By doing so, it is possible to output an uncompressed test result at the timing of the test clock signal.

Other objects and features of this invention will become apparent from the following description with reference to the accompanying drawings.

DESCRIPTION OF THE PREFERRED EMBODIMENTS

Preferred embodiments of the present invention will be described hereinafter in detail with reference to the accompanying drawings. However, the present invention in not limited only to the following embodiments.

Figure 1:
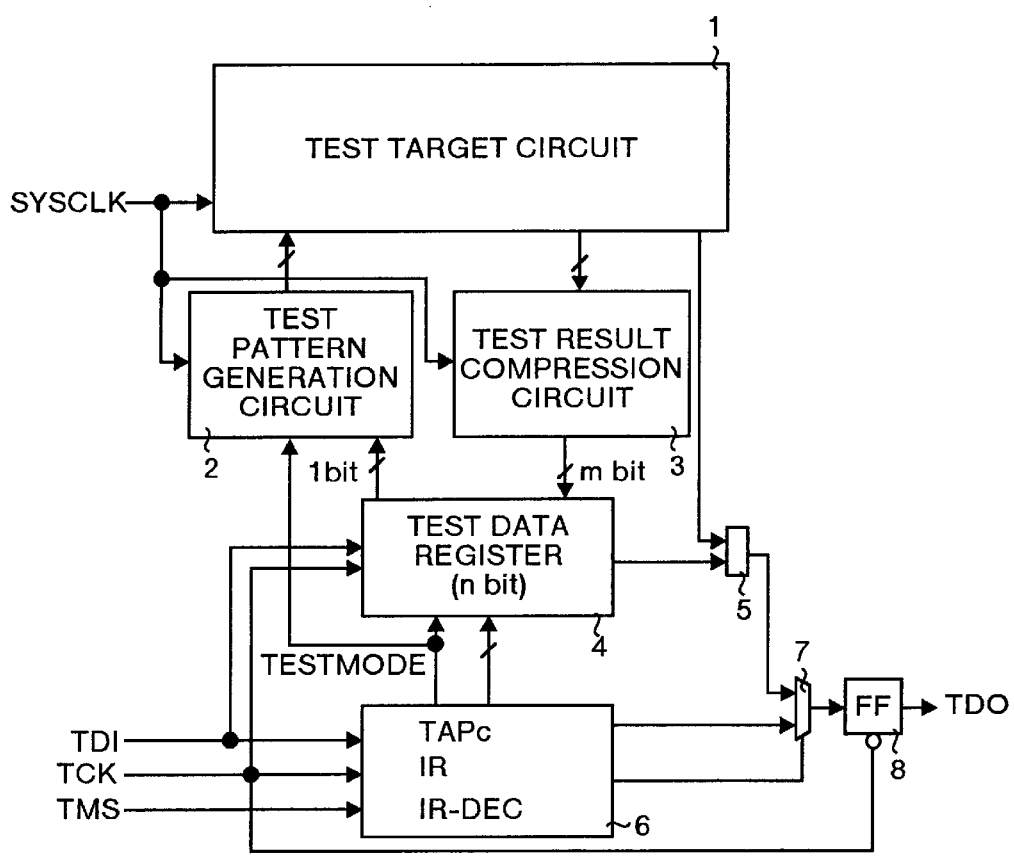
FIG. 1 is a block diagram of a semiconductor integrated circuit in the first embodiment according to the present invention.

FIG. 1 is a block diagram of a semiconductor integrated circuit in the first embodiment according to the present invention. This semiconductor integrated circuit is constituted according to the specification of IEEE1149.1. The semiconductor integrated circuit comprises a test target circuit 1 (a circuit to be tested). The semiconductor integrated circuit further comprises a test pattern generation circuit 2 which generates a signal used for a test and outputting the test signal to the test circuit 1, and a test result compression circuit 3 which receives test result from the test target circuit 1 and compresses the test result. The semiconductor integrated circuit further comprises a test data register 4 which outputs data to the test pattern generation circuit 2 and receives the compressed test results from the test result compression circuit 3.

The semiconductor integrated circuit also comprises a selector circuit 5 which selects and outputs either the test results scanned out from the test target circuit 1 or the test results stored in the test register 4, a TAPc (test access port controller) 6 inputting a test data-in (TDI) signal and a test mode select (TMS) signal from a not shown signal generation apparatus provided outside the semiconductor integrated circuit, and outputs data to the test register 4. The semiconductor integrated circuit further comprises a selector circuit 7 which selects and outputs either a signal from the selector circuit 5 or a signal from the TAPc6 under the control by the TAPc6, and a flip-flop (FF) circuit 8 which latches a signal from the selector circuit 7 at the timing of the falling edge of a test clock (TCK) signal used for the test and outputs the latched signal to a TDO (test data out) terminal.

The TAPc 6 outputs a test mode change-over signal (TESTMODE signal) for controlling change-over between a test mode for executing the test and a normal operation mode for conducting a normal operation for the test pattern generation circuit 2 and the test data register 4. While FIG. 1 shows a case where the TAPc6 sets the TESTMODE signal, the TESTMODE signal may be set directly from the external pin of a chip.

Figure 2:
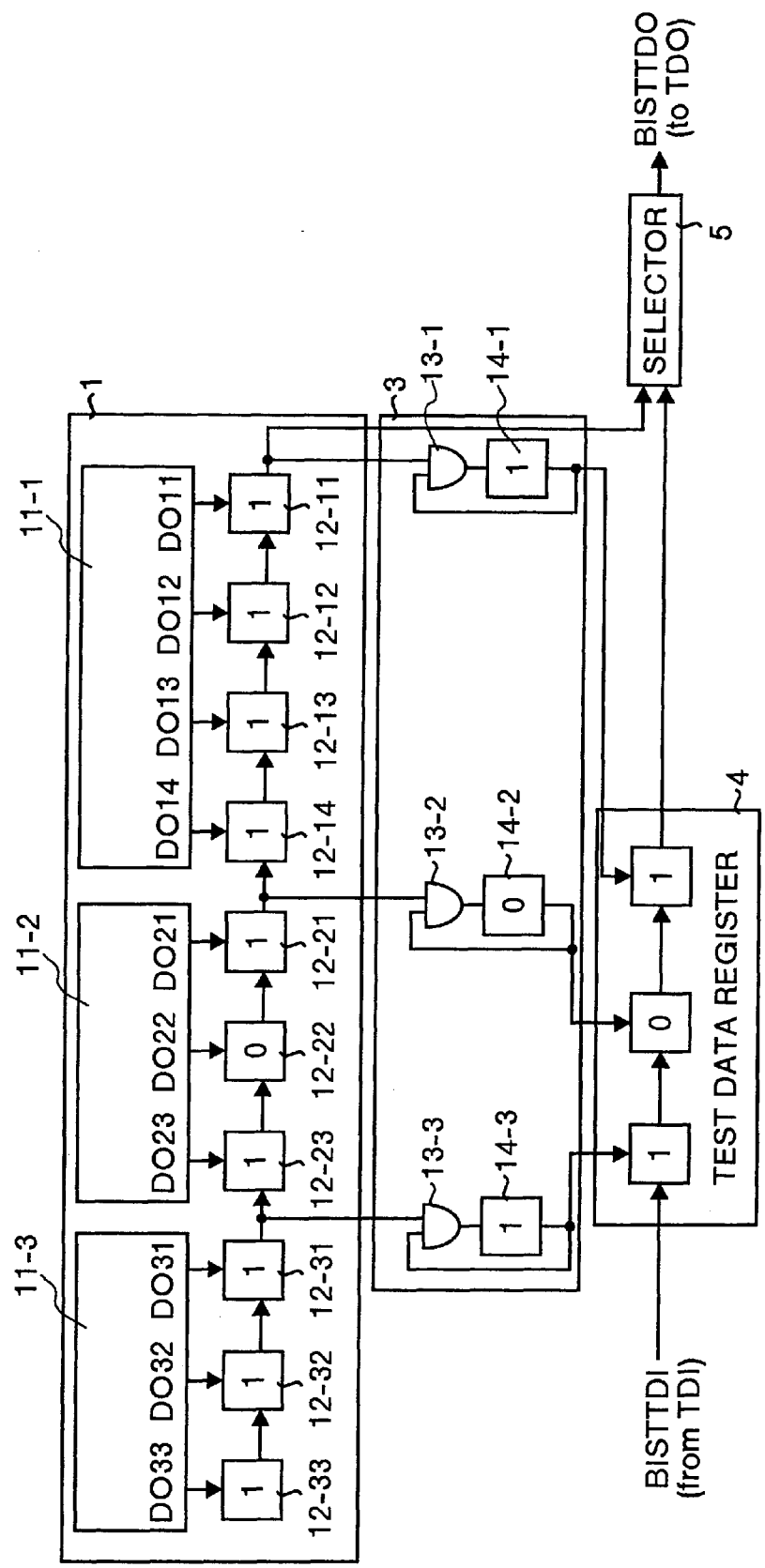
FIG. 2 is a block diagram which shows a detail configuration of a test target circuit, a test result compression circuit and a test data register shown in FIG. 1.

FIG. 2 is a block diagram which shows a detail configuration of the test target circuit 1, the test result compression circuit 3 and the test data register 4 shown in FIG. 1. The test target circuit 1 comprises a plurality of test target blocks 11-1 to 11-3, and test result holding circuits 12-11 to 12-14, 12-21 to 12-23 and 12-31 to 12-33 inputting and holding test results from the output terminals DO11 to DO14, DO21 to DO23 and DO31 to DO33 of the test target blocks 11-1 to 11-3, respectively.

The test result compression circuit 3 comprises AND circuits 13-1 to 13-3 inputting the test results shifted out from the test result holding circuits 12-11 to 12-14, 12-21 to 12-23 and 12-31 to 12-33 corresponding to the test blocks 11-1 to 11-3, respectively at one input terminals thereof, and holding circuits 14-1 to 14-3 holding the output signals of the respective AND circuits 13-1 to 13-3 and outputting the held signals to the other input terminals of the respective AND circuits 13-1 to 13-3 and to the test register 4.

The test target circuit 1, the test pattern generation circuit 2 and the test result compression circuit 3 operate using a system clock (SYSCLK) signal with an actual operating frequency. On the other hand, the test data register 4 and the TAPc 6 operate using a TCK signal with a lower frequency than the actual operating frequency. The test pattern generation circuit 2 sets the level of a hold signal at low synchronously with the edge of the TCK signal after the completion of the test and scans out the test results from the test target circuit 1. The SYSCLK signal and the TCK signal are supplied from an external signal generation apparatus, which is not shown, to the semiconductor integrated circuit.

The test result compression circuit 3 compresses the test results from the respective output terminals DO11 to DO14, DO21 to DO23 and DO31 to DO33 into one bit for the test target blocks 11-1 to 11-3, respectively, and outputs the compressed test results to the test data register 4. The number n of bits of the test data register 4 is set higher than the number m of bits after compression by the test result compression circuit 3. The test result holding circuits 12-11 to 12-33 are connected in series and constitute a scan path as a whole. The selector circuit 5 selects either the test results scanned out from the scan path or the compressed test results from the test data register 4 and outputs the selected test results. Namely, there are two paths to output the test results to the TDO terminal, either of which can be arbitrarily selected.

If the test results are outputted from the test data register 4, first, an instruction is set to the test data register 4 in a ShiftDR state. Next, in an UpdateDR state, the instruction is applied from the test data register 4 to the test pattern generation circuit 2. A BIST is then executed in a RunTest/Idle state. Test results are compressed by the test result compression circuit 3. Thereafter, in a CaptureDR state, the test results compressed by the test result compression circuit 3 are stored in the data register 4. In a ShiftDR state, the data stored in the test data register 4 is outputted from the TDO terminal.

Figure 3:
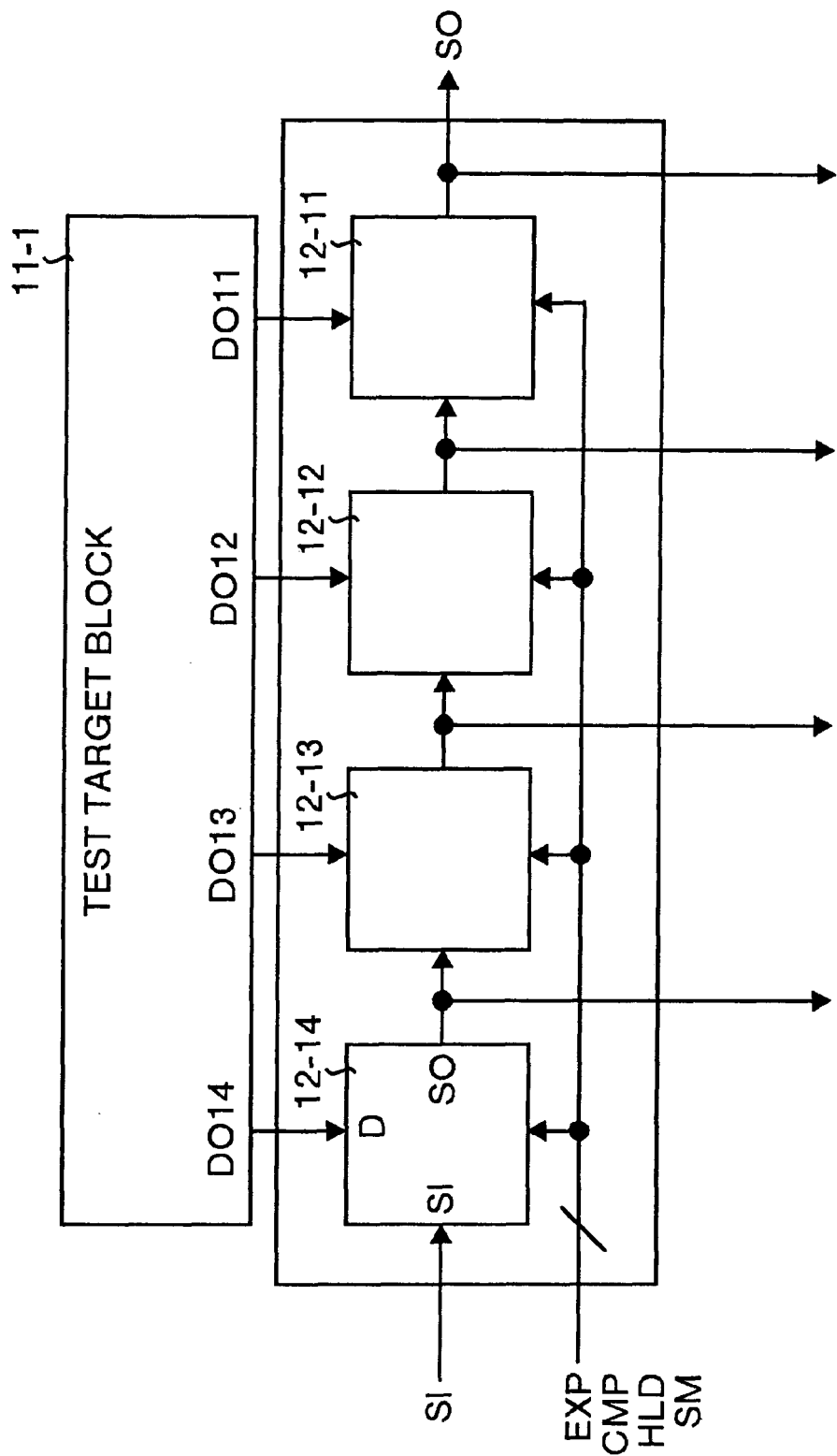
FIG. 3 shows the input and output of signals in a test result holding circuit shown in FIG. 2.

FIG. 3 shows the input and output of signals in the test result holding circuit shown in FIG. 2. The output terminals DO11 to DO14 of the test target block 11-1 are connected to the data input terminals (D terminals) of the test result holding circuits 12-11 to 12-14, respectively. The scan-out (SO) terminals of the earlier-stage test result holding circuits are connected to the scan-in (SI) terminals thereof, respectively. Each of the test result holding circuits 12-11 to 12-14 inputs an expected value (EXP) signal, a comparison (CMP) signal, a hold (HLD) signal and a scan mode (SM) signal from the test pattern generation circuit 2.

Here, the EXP signal is a signal to be outputted from the output terminals of the respective test target blocks if the test target circuit 1 is normal. The CMP signal is a signal for controlling a comparison processing for comparing the EXP signal with the output signal of the test target circuit 1. If the CMP signal is "1", comparison is conducted and if the CMP signal is "0", comparison is not conducted. The HLD signal is a signal for controlling the holding/shifting of data of the respective test result holding circuits 12-11 to 12-33. If the HLD signal is "1", the data is held and if "0", the data is shifted. The SM signal is a signal for controlling the scan mode.

Figure 4:
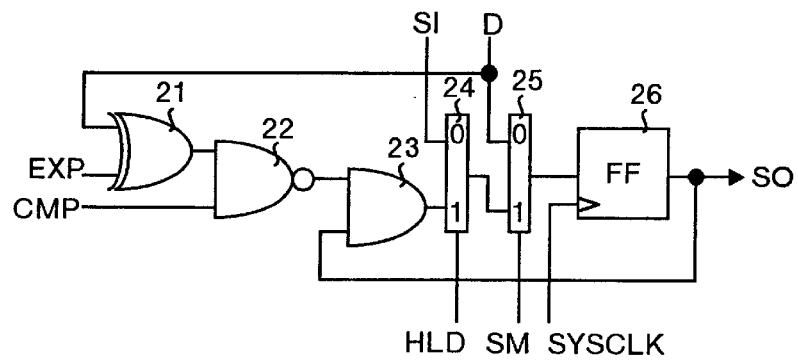
FIG. 4 is a block diagram of the test result holding circuit shown in FIG. 2.

FIG. 4 is a block diagram of the test result holding circuit shown in FIG. 2. The test result holding circuits 12-11 to 12-33 have the same constitution. Namely, each test holding circuit comprises an EXOR circuit 21 inputting the D signal and the EXP signal from the D terminal, calculating and outputting the exclusive OR of these signals, an NAND circuit 22 inputting the output signal of the EXOR circuit 21 and the CMP signal, calculating and outputting the negation of the logical product of these signals, and an AND circuit 23 inputting the output signal of the NAND circuit 22 and the SO signal of an SO terminal, calculates and output the logical product of these signals.

Each of the test result holding circuits 12-11 to 12-33 also comprises a selector circuit 24 inputting the output signal of the AND circuit 23, the SI signal of the SI terminal and the HLD signal, selecting and outputting the SI signal if the HLD signal is "0" (low level) and selecting the output signal of the AND circuit 23 if the HLD signal is "1" (high level), a selector circuit 25 inputting the output signal of the selector circuit 24, the D signal and the HLD signal, selecting and outputting the D signal if the HLD signal is "0" and selecting the output signal of the selector circuit 24 if the HLD signal is "1", and a flip-flop (FF) circuit 26 inputting the output signal of the selector circuit 25 and the SYSCLK signal and outputting an output signal to the SO terminal.

Figure 5:
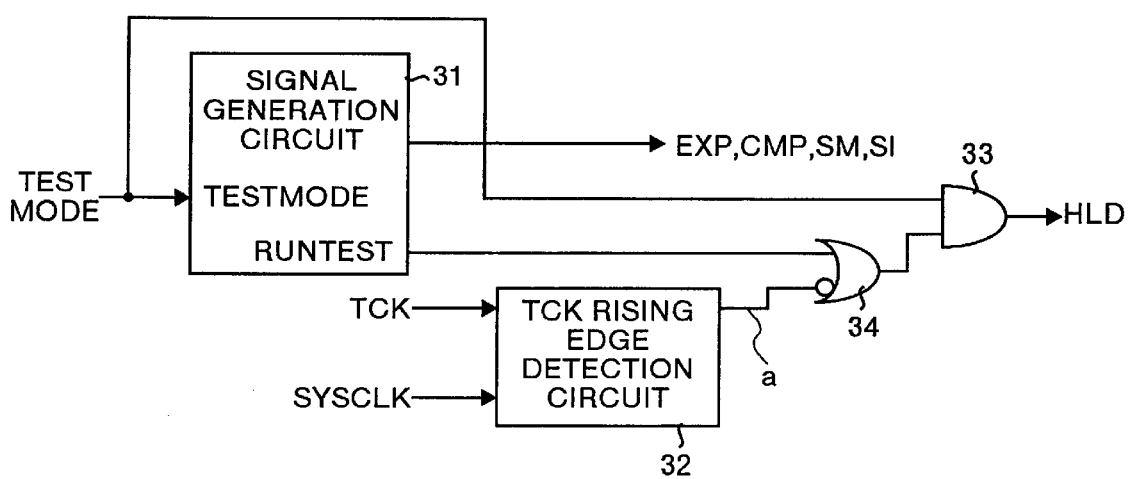
FIG. 5 is a block diagram of a test pattern generation circuit shown in FIG. 1.

FIG. 5 is a block diagram showing the test pattern generation circuit 2 shown in FIG. 1. The test pattern generation circuit 2 comprises a signal generation circuit 31 outputting a RUNTEST signal indicating a period for actually conducting the test, a TCK rising edge detection circuit 32 inputting the TCK signal and the SYSCLK signal, detecting the rising edge of the TCK signal and outputting a high-level pulse corresponding to one cycle of the SYSCLK signal, an OR circuit 34 inputting the negation of the output signal a of the TCK rising edge detection circuit 32 and the RUNTEST signal from the signal generation circuit 31, calculating and outputting the logical OR of these signals, and an AND circuit 33 inputting the output signal of the OR circuit 34 and the TESTMODE signal from the TAPc6, calculating and outputting the logical product of these signals.

The signal generation circuit 31 outputs the EXP signal, the CMP signal, the SM signal and the SI signal as well as the TESTMODE signal and the RUNTEST signal to the test result holding circuits 12-11 to 12-33. The TCK rising edge detection circuit 32 inputs the TCK signal and the SYSCLK signal, detects the rising edge of the TCK signal and then outputs a high-level pulse corresponding to one cycle of the SYSCLK signal synchronously with the rising of the SYSCLK signal. The OR circuit 34 inputs the negation of the output signal of the TCK rising edge detection circuit 32 and the RUNTEST signal from the signal generation circuit 31, calculates and outputs the logical OR of these signals. The AND circuit 33 inputs the output signal of the OR circuit 34 and the TESTMODE signal from the TAPc 6, calculates the logical product of these signals and outputs a calculation result as an HLD signal to each of the test result holding circuits 12-11 to 12-33.

When providing data "1" at the FF26 of each of the test result holding circuits 12-11 to 12-33, the test pattern generation circuit 2 scans a signal of data "1" in the scan path, and sets the SM signal, the HLD signal and the CMP signal at "1", "0" and "0", respectively. Th EXP signal is DC (Do not Care). As a result, data "1" is set at the FF circuit 26 of each of the test result holding circuits 12-11 to 12-33. Next, the test pattern generation circuit 2 sets the CMP signal at "1", applies expected values outputted from the output terminals of the respective test target blocks to the EXP signal, and tests the test target circuit 1. As a result, "0" is set at the FF 26 of the test result holding circuit corresponding to the fault portion of the test target circuit 1. After the completion of the test, the test pattern generation circuit 2 sets the CMP signal at "0", sets the HLD signal at "0" for a predetermined period, synchronously with the edge of the TCK signal and scans out the test result.

Figure 6:
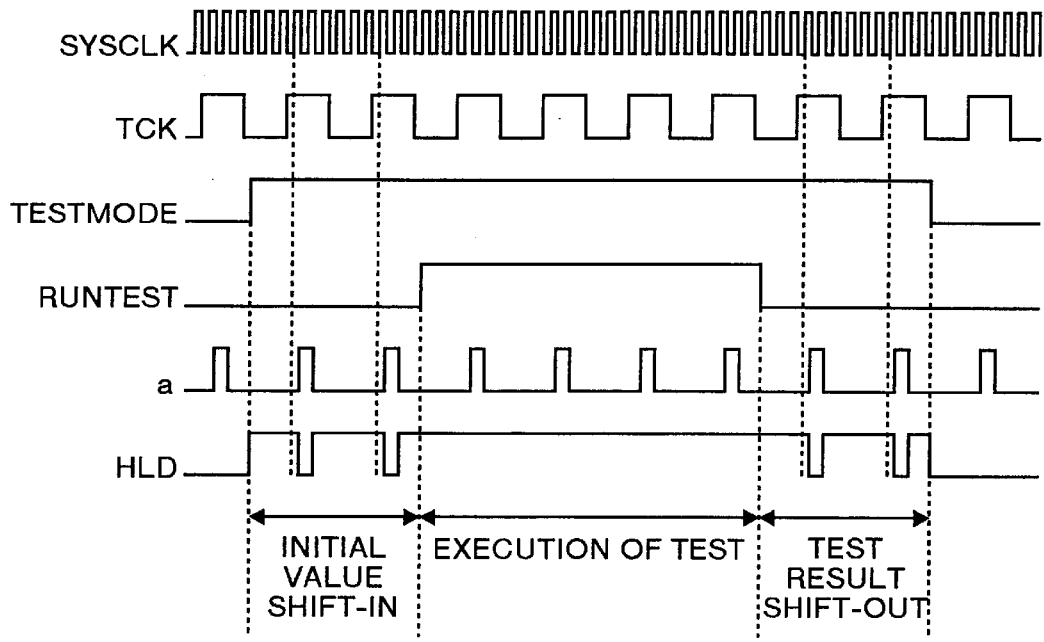
FIG. 6 is a timing chart showing the operation of the semiconductor integrated circuit in the first embodiment.

Operation of the first embodiment will be described hereinafter with reference to the timing charts of FIG. 6 and FIG. 7. FIG. 6 is a timing chart showing the operation of the semiconductor integrated circuit in the first embodiment. In the operation of the semiconductor integrated circuit, first, the TESTMODE signal rises from a state in which the levels of both the RUNTEST signal and the TESTMODE signal are low. Then, the level of the HLD signal is low while level of the output signal a of the TCK rising edge detection circuit 32 is high and is high while the level of the signal a is low until the RUNTEST signal rises. As a result, initial values are shifted in the respective test result holding circuits 12-11 to 12-33 synchronously with the rising edge of the TCK signal.

Next, the RUNTEST signal rises and the levels of both the RLTNTEST signal and the TESTMODE signal become high. Consequently, the level of the HLD signal becomes high and a test is executed to the test target circuit 1. After the passage of a predetermined time, the RUNTEST signal falls and the test is finished. Thereafter, the level of the ULD signal is low while the level of the signal a is high and is high while the level of the signal a is low until the TESTMODE falls. As a result, the test results held by the respective test result holding circuits 12-11 to 12-13 are shifted out synchronously with the rising edge of the TCK signal and outputted from the TDO terminal.

Next, a case in which the falling of the HLD signal is deviated from the desired rising timing of the SYSCLK due to a setup error or a hold error will be explained. FIG. 7 is a timing chart showing the operation of the semiconductor integrated circuit in a case where the timing of the HLD signal is deviated in the first embodiment. In the operation of this semiconductor integrated circuit, the TCK signal and the SYSCLK signal have different clock domains. Due to this, the HLD signal may fall synchronously not with the desired rising timing of the SYSCLK signal but with the next timing.

Figure 7:
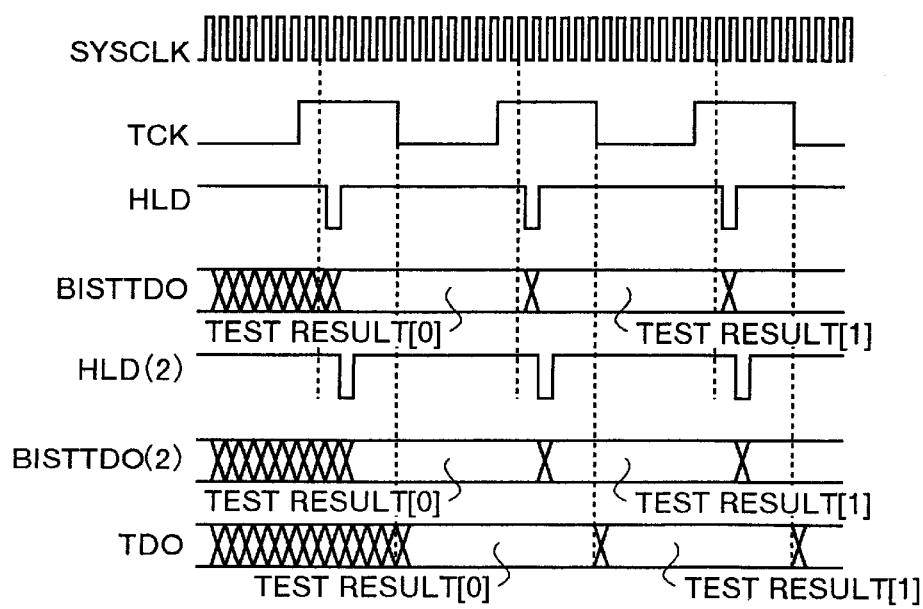
FIG. 7 is a timing chart showing the operation of the semiconductor integrated circuit if the timing of an HLD signal in the first embodiment is deviated.

In FIG. 7, HLD denotes an HLD signal which falls at predetermined timing and HLD(2) denotes an HLD signal which falls at the next timing of the desired timing. Also, BISTTDO denotes a BISTTDO signal outputted from the selector 5 if the HLD signal falls at the desired timing, and BISTTDO(2) denotes a BISTTDO signal if the HLD signal falls at the next timing of the desired timing. As can be seen, even if the rising timing of the HLD signal is deviated by one cycle of the SYSCLK signal, the frequency of the TCK signal is sufficiently lower than that of the SYSCLK signal and the test results are, therefore, outputted from the TDO terminal at the same timing as the desired timing at which the HLD signal falls.

As explained above, according to the first embodiment, the scan path having the test result holding circuits 12-11 to 12-33 which are connected in series, executes a test to the test target blocks 11-1 to 11-3. After the completion of test, the test pattern generation circuit 2 sets the level of the HLD signal low synchronously with the edge of the TCK signal. As a result, an uncompressed test result can be outputted at the timing of the TCK signal and a detailed fault portion can be, therefore, specified.

Figure 8:
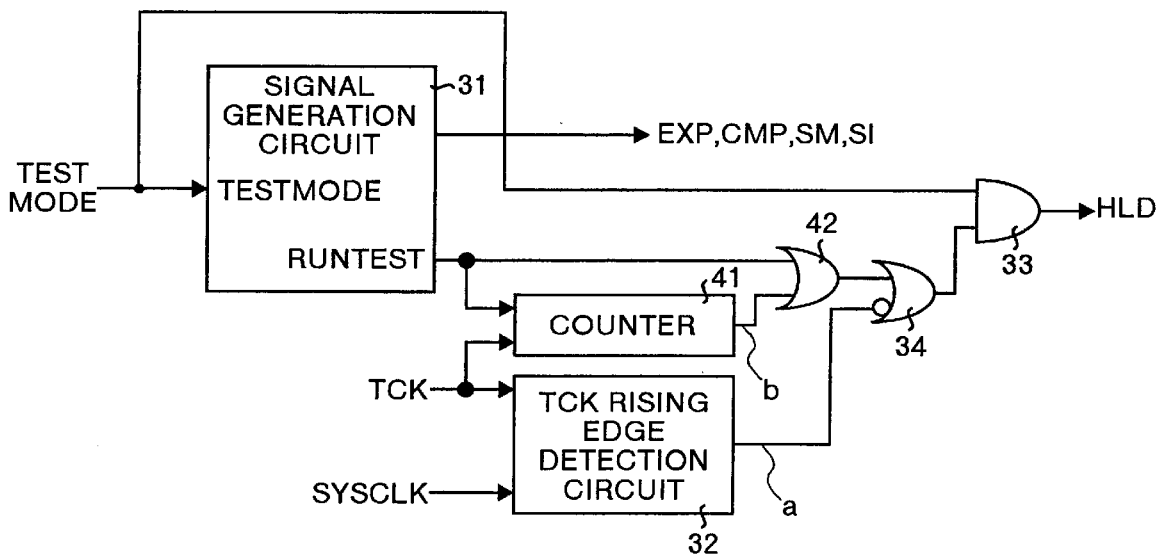
FIG. 8 is a block diagram of a test pattern generation circuit in the second embodiment according to the present invention.

A second embodiment of the present invention will now be explained. In this second embodiment, in the configuration of the first embodiment, after the completion of the test, a dummy cycle is provided for a predetermined time until the test results are shifted out. The second embodiment intends to cancel the deviation of timing among BIST control signals (such as the TESTMODE signal) and the deviation of phase between the TCK signal and the SYSCLK signal. FIG. 8 is a block diagram of a test pattern generation circuit according to the second embodiment. Sections which have same functions as the sections in the first embodiment shown in FIG. 5 are provided with the same legends in this second embodiment. In this test pattern generation circuit, an OR circuit 42 is additionally provided, in the configuration of the first embodiment, between the output terminal of the RUNTEST signal of the signal generation circuit 31 and the input terminal of the OR circuit 34, and a counter circuit 41 which receives the RUNTEST signal and the TCK signal from the signal generation circuit 31 and outputs a signal obtained by delaying the rising of the RUNTEST signal by a predetermined time to the OR circuit 42.

The OR circuit 42 receives the RUNTEST signal and the output signal b of the counter circuit 41, calculates and outputs a logical OR of these signals to the OR circuit 34. The counter circuit 41 receives the RUNTEST signal and the TCK signal, counts the TCK signal in a predetermined cycle from the falling of the RUNTEST signal and outputs a signal obtained by delaying the falling of the RUNTEST signal by a predetermined cycle to the OR circuit 42. The constituent elements other than those of the test pattern generation circuit are the same as those in the first embodiment.

Figure 9:
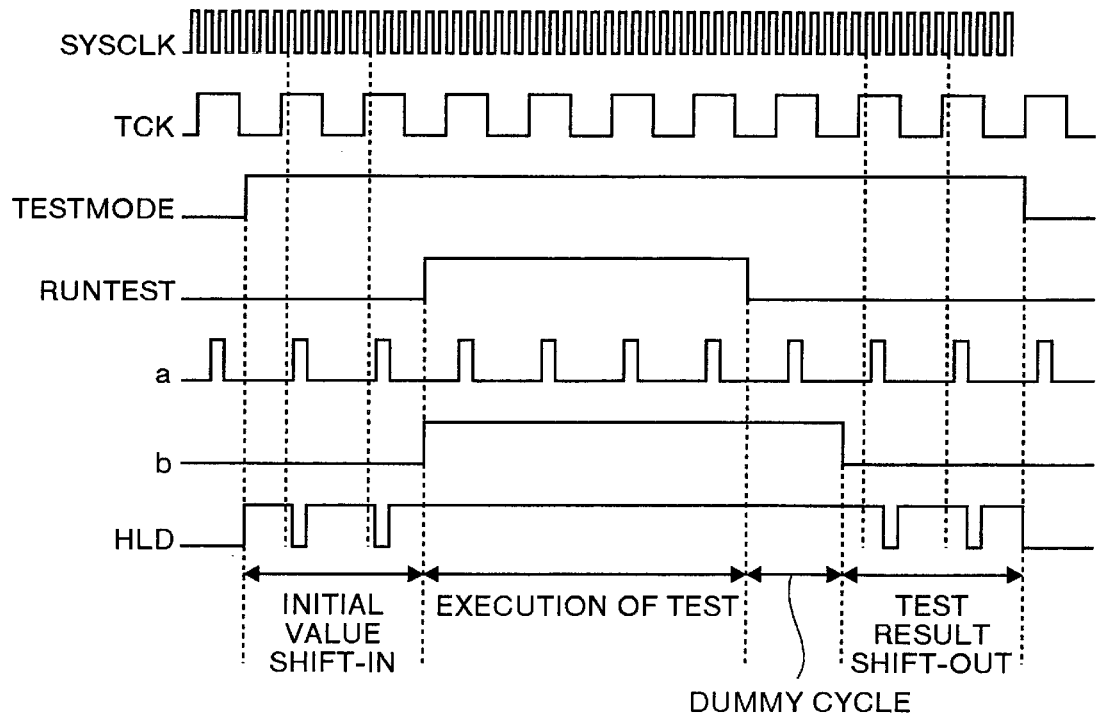
FIG. 9 is a timing chart showing the operation of a semiconductor integrated circuit in the second embodiment.

Operation of the second embodiment will be described with reference to the timing chart of FIG. 9. FIG. 9 is a timing chart showing the operation of a semiconductor integrated circuit in the second embodiment according to the present invention. In the operation of this semiconductor integrated circuit, first, the TESTMODE signal rises from a state in which the levels of both the RUNTEST signal and the TESTMODE signal are low. Then, the level of the HLD signal is low while the output signal a of the TCK rising edge detection circuit 32 is high and is high while the level of the signal a is low until the output signal of the OR circuit 42 rises. As a result, initial values are shifted in the respective test result holding circuits 12-11 to 12-33 synchronously with the rising edge of the TCK signal.

Next, the RUNTEST signal rises, whereby the output signal b of the counter circuit 41 rises, the output signal of the OR circuit 42 rises and the level of the HLD signal becomes high. Then, a test is executed to the test target circuit 1. After the passage of a predetermined time, the RUNTEST signal falls and the test is finished. The counter circuit 41 keeps the level of the output signal b high until the counting of the TCK signal in a predetermined cycle is completed after the RUNTEST signal falls, and makes the output signal b fall after completing the counting of the TCK signal in the predetermined cycle.

In other words, after the completion of the test, a predetermined dummy cycle is provided. By providing so, it is possible to cancel the deviation of timing among the respective constituent elements other than the TCK rising edge detection circuit 32. After the signal b falls until the TESTMODE signal falls, the level of the HLD signal is low while the level of the signal a is high and is high while the level of the signal a is low. As a result, the test results held by the respective test result holding circuits 12-11 to 12-33 are shifted out synchronously with the rising edge of the TCK signal and outputted from the TDO terminal.

As explained above, according to the second embodiment, the counter circuit 41 counts a predetermined time after the completion of the test. After the counter circuit 41 counts the predetermined time, the test pattern generation circuit sets the level of the HLD signal low synchronously with the edge of the TCK signal. By doing so, the deviation of timing among BIST control signals and the deviation of phase between the TCK signal and the SYSCLK signal can be canceled and an appropriate test can be, therefore, conducted to the semiconductor integrated circuit.

Figure 10:
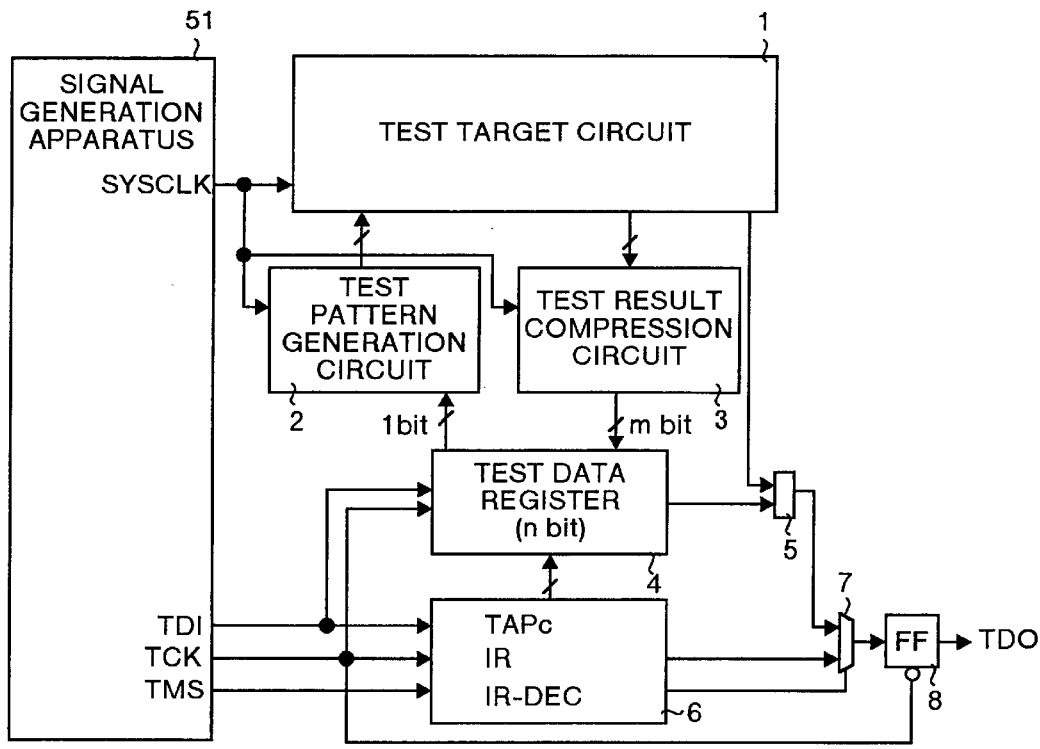
FIG. 10 is a block diagram of a semiconductor integrated circuit in the third embodiment according to the present invention.

A third embodiment of the present invention will now be explained. In this third embodiment, in the configuration of the first embodiment, a signal generation apparatus which supplies the TCK signal to the semiconductor integrated circuit stops the supply of the TCK signal during a certain time period after the completion of the test, and thereafter resumes the supply of the TCK signal. FIG. 10 is a block diagram of the semiconductor integrated circuit according to the third embodiment. Sections which have similar functions as the sections shown in FIG. 1 are provided with the same legends.

This semiconductor integrated circuit has the same constitution as that of the semiconductor integrated circuit in the first embodiment. The semiconductor integrated circuit receives the SYSCLK signal, the TDI signal, the TCK signal and the TMS signal from a signal generation apparatus 51 provided outside the semiconductor integrated circuit. The signal generation apparatus 51 stops the supply of the TCK signal to the semiconductor integrated circuit until a time required for execution of the test (i.e. a test execution time) and a dummy cycle time pass after the RUNTEST signal rises, and then resumes the supply of the TCK signal.

Figure 11:
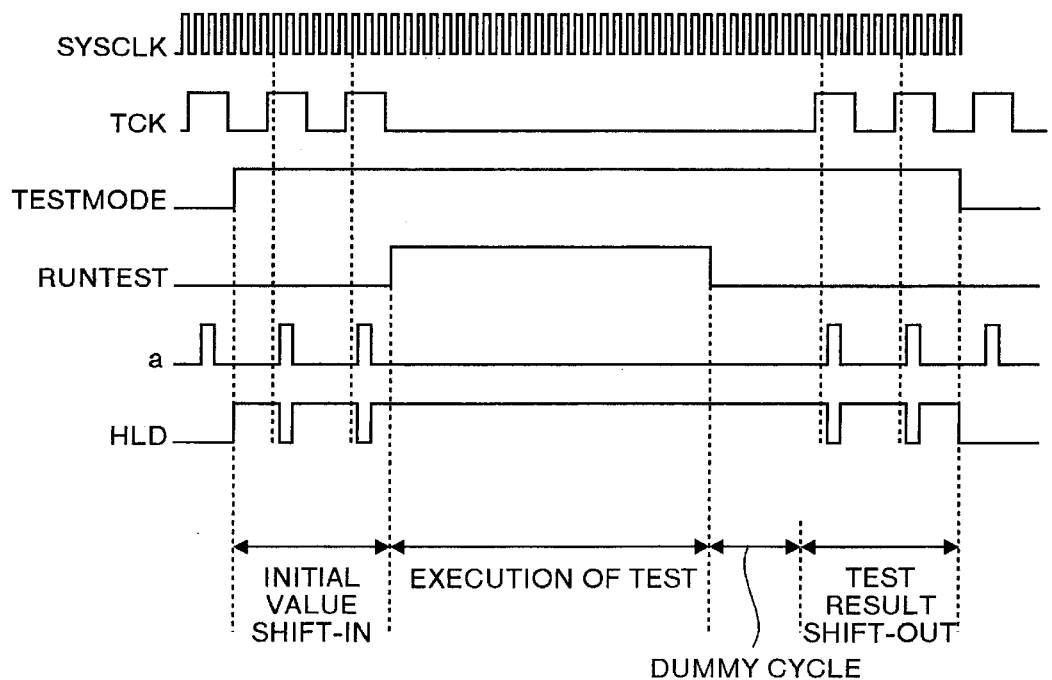
FIG. 11 is a timing chart showing the operation of the semiconductor integrated circuit in the third embodiment.
Figure 12:
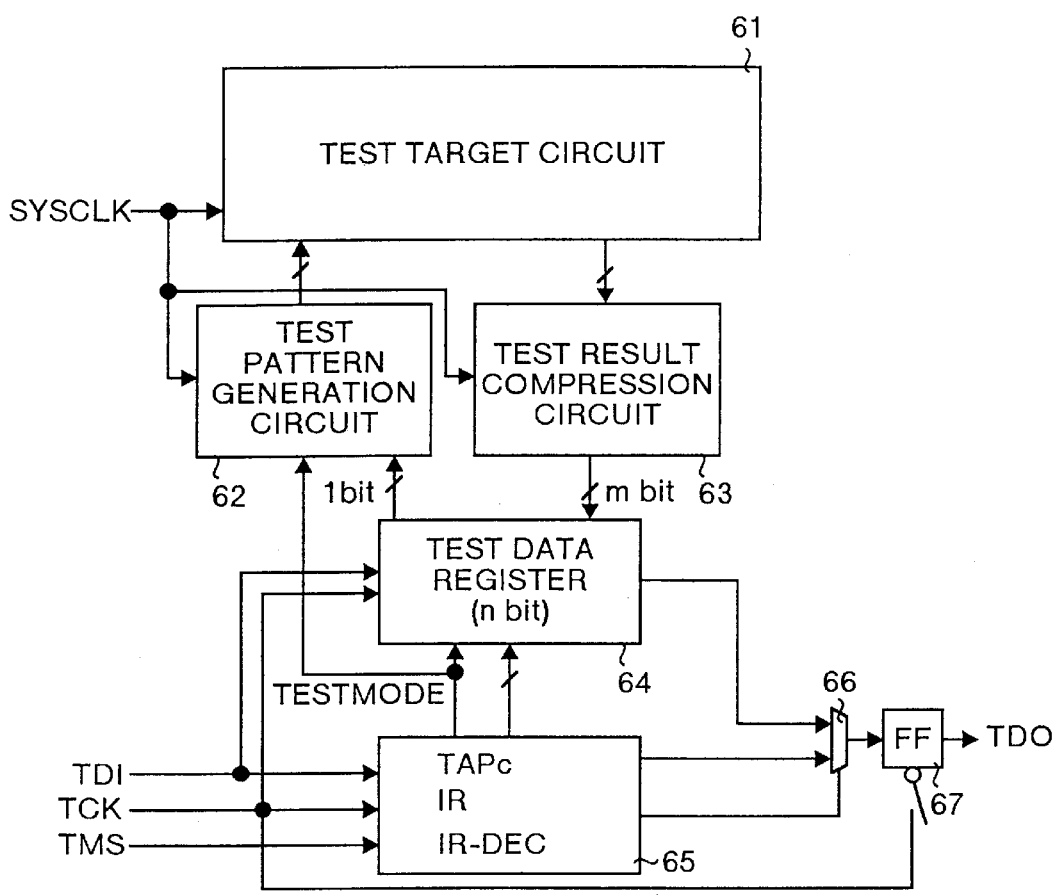
FIG. 12 is a block diagram of a conventional semiconductor integrated circuit.
Figure 13:
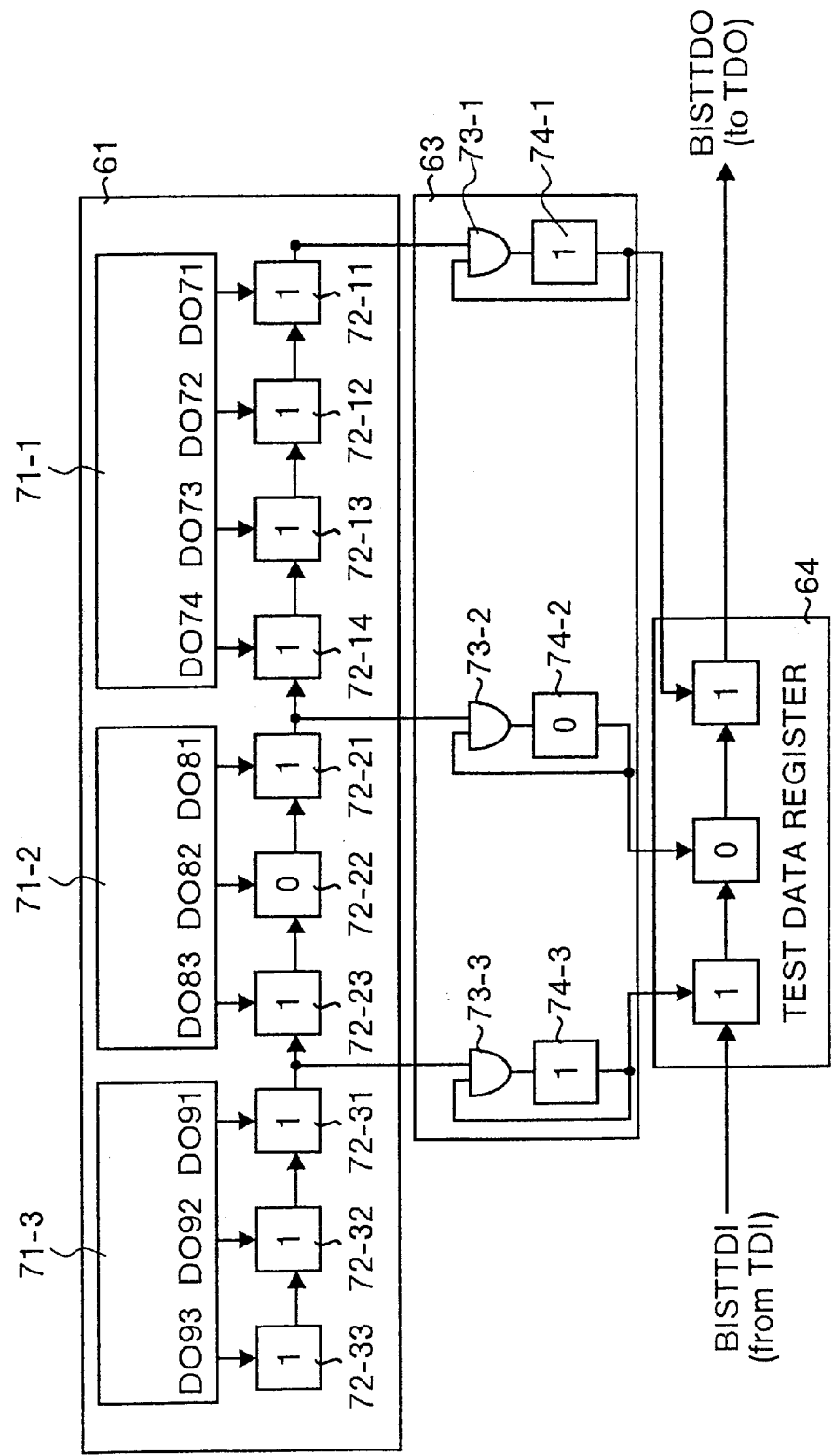
FIG. 13 is a block diagram showing a test target circuit, a test result compression circuit and a test data register shown in FIG. 12.

Operation of the third embodiment will be described with reference to the timing chart of FIG. 11. FIG. 11 is a timing chart showing the operation of the semiconductor integrated circuit in the third embodiment. To begin with, the TESTMODE signal rises from a state in which the levels of both the RUNTEST signal and the TESTMODE signal are low. Then, the level of the HLD signal is low while the level of the output signal a of the TCK rising edge detection circuit 32 is high and is high while the level of the output signal a is low until the RUNTEST signal rises. As a result, initial values are shifted in the respective test result holding circuits 12-11 to 12-33 synchronously with the rising edge of the TCK signal.

Next, the RUNTEST signal rises, the level of the HLD signal becomes high and a test is executed to the test target circuit 1. Also, the signal generation circuit 51 stops the supply of the TCK signal. Timing at which the supply of the TCK signal is stopped is not be limited to the timing at which the RUNTEST signal rises and may be set as desired within the period in which the level of the RUNTEST signal is high. After the passage of a predetermined time after the rising of the RUNTEST signal, the RUNTEST signal falls and the test is finished. After the RUNTEST signal falls and after the dummy cycle time passes, the signal generation apparatus 51 resumes the supply of the TCK signal.

By doing so, the deviations of timing among the respective constituent elements other than the TCK rising edge detection circuit 32 can be cancelled. In addition, since there is no need to provide a counter circuit, circuit scale becomes small and the load of test pattern generation CAD can be reduced. Until the TESTMODE signal falls after the supply of the TCK signal is resumed, the level of the HLD signal is low while the level of the signal a is high and is high while the level of the signal a is low. As a result, the test results held by the respective test result holding circuits 12-11 to 12-33 are shifted out synchronously with the rising edge of the TCK signal and outputted from the TDO terminal.

As explained above, according to the third embodiment, the signal generation apparatus 51 stops the supply of the TCK signal to the semiconductor integrated circuit for a certain period of time after the completion of the test, and resumes the supply of the TCK signal to the semiconductor integrated circuit after the passage of that certain period of time. The test pattern generation circuit 2 sets the level of the HLD signal low synchronously with the edge of the TCK signal after the signal generation apparatus 51 resumes the supply of the TCK signal to the semiconductor integrated circuit. By doing so, the deviation of timing among BIST control signals and the deviation of phase between the TCK signal and the SYSCLK signal can be cancelled, and an appropriate test can be, therefore, conducted to the semiconductor integrated circuit.

According to the present invention, the test circuit having the scan path executes a test to the semiconductor integrated circuit, and, after the completion of the test, the control circuit generates a scan-out control signal for scanning out test results synchronously with the edge of a test clock signal with a lower frequency than the actual operating frequency and outputs the scan-out control signal to the test circuit. As a result, it is possible to output an uncompressed test result at the timing of the test clock signal. Thus, there is an advantage that, a faulty section can be accurately pinpointed.

Furthermore, after the completion of the test, the counter circuit counts a certain time period, thereafter, the control circuit generates a scan-out control signal and outputs the scan-out control signal to the test circuit. It is thereby possible to cancel timing deviation. Thus, an appropriate semiconductor integrated circuit test can be advantageously carried out.

Furthermore, the supply of the test clock signal to the control circuit is stopped for a certain time after the completion of the test, thereafter, the supply of the test clock signal to the control circuit is resumed, thereafter, the control circuit generates a scan-out control signal and outputs the scan-out control signal to the test circuit. It is thereby possible to cancel the deviation of timing among BIST control signals. Thus, an appropriate semiconductor integrated circuit test can be advantageously carried out.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus which uses an actual operating frequency of a semiconductor integrated circuit for testing the semiconductor integrated circuit, said apparatus comprising:
    a test circuit having a scan path for executing a test;
    a control circuit which generates, after completion of the test, a scan-out control signal for scanning out a test result synchronously with an edge of a test clock signal with a lower frequency than the actual operating frequency, and outputs the scan-out control signal to said test circuit; and
    a counter circuit which measures a desired time after the completion of the test, wherein said control circuit generates the scan-out control signal only after said counter circuit has finished measurement of the desired time.

2. An apparatus which uses an actual operating frequency of a semiconductor integrated circuit for testing the semiconductor integrated circuit, said apparatus comprising:
    a test circuit having a scan path for executing a test;
    a control circuit which generates, after completion of the test, a scan-out control signal for scanning out a test result synchronously with an edge of a test clock signal with a lower frequency than the actual operating frequency, and outputs the scan-out control signal to said test circuit; and
    a clock control circuit which stops supply of the test clock signal to said control circuit during a time period after completion of the test and thereafter resumes the supply of the test clock signal, wherein said control circuit generates the scan-out control signal only after said clock control circuit has resumed the supply of said clock signal.

3. An apparatus which uses an actual operating frequency of a semiconductor integrated circuit for testing the semiconductor integrated circuit, said apparatus comprising:
    a test circuit having a scan path for executing a test;
    a control circuit which generates, after completion of the test, a scan-out control signal for scanning out a test result synchronously with an edge of a test clock signal with a lower frequency than the actual operating frequency, and outputs the scan-out control signal to said test circuit, wherein said control circuit generates the scan-out control signal only after lapse of a first time period; and
    a timer which measures time, outputs a signal to said control circuit when said timer has measured the first time period, and resets after the first time period.

* * * * *